(12) United States Patent
Gupta (10) Patent No.: US 7,389,377 B2
(45) Date of Patent: Jun. 17, 2008

(54) ACCESS CONTROL LIST PROCESSOR

(75) Inventor: Pankaj Gupta, Palo Alto, CA (US)

(73) Assignee: NetLogic Microsystems, Inc., Mountain View, CA (US)

(*) Notice: Subject to any disclaimer, the term of this patent is extended or adjusted under 35 U.S.C. 154(b) by 216 days.

(21) Appl. No.: 11/426,011

(22) Filed: Jun. 22, 2006

(65) Prior Publication Data

US 2006/0294297 A1 Dec. 28, 2006

Related U.S. Application Data

(60) Provisional application No. 60/692,817, filed on Jun. 22, 2005.

(51) Int. Cl.
*G06F 12/00* (2006.01)
(52) U.S. Cl. ...................................... 711/108
(58) Field of Classification Search ................ 711/108, 711/169
See application file for complete search history.

(56) References Cited

U.S. PATENT DOCUMENTS

| 6,898,099 | B1 | 5/2005 | Srinivasan et al. | |
|---|---|---|---|---|
| 6,988,106 | B2* | 1/2006 | Enderwick et al. | 707/100 |
| 7,143,231 | B1* | 11/2006 | Srinivasan et al. | 711/108 |
| 2002/0129198 | A1* | 9/2002 | Nataraj et al. | 711/108 |

OTHER PUBLICATIONS

Ian N. Robinson, "Pattern Addressable Memory", IEEE Micro, Jun. 1992, pp. 20-30.*

Donald R. Morrison, "PATRICIA—Practical Algorithm to Retrieve Information Coded in Alphanumeric," Journal of the ACM, Oct. 1968, pp. 514-534, vol. 15, No. 4.*
MOSAID, The Next Generation of Content Addressable Memories, MOSAID Technologies Incorporated, Sep. 1999, 8 pages.*
Pankaj Gupta et al., "Routing Lookups in Hardware at memory Access Speeds", Proc. Infocom, Apr. 1998.*
International Search Report; European Patent Office in application No. PCT/US06/24578; Aug. 8, 2007; 12 Pgs.
K. Lakshminarayanan, A. Rangarajan, S. Venkatachary, Algorithms for Advanced Packet Classification with Ternary CAMs, SIGCOMM '05 Aug. 21-25, 2005, 12 pages.

* cited by examiner

*Primary Examiner*—Pierre-Michel Bataille
(74) *Attorney, Agent, or Firm*—Shemwell Mahamedi LLP (57) ABSTRACT

An integrated circuit device for processing an access control list. The integrated circuit device includes a first content addressable memory (CAM) including a plurality of CAM blocks to generate respective match indices, each match index indicating a storage location within the corresponding CAM block of an entry that matches a search key. The integrated circuit device further includes a plurality of memory arrays to receive the match indices from the CAM blocks and to output respective lookup values from storage locations indicated by the match indices, each lookup value including information that indicates an action to be taken with respect to a packet used to obtain the search key and information that indicates a priority of the action relative to actions indicated by information in others of the lookup values.

21 Claims, 7 Drawing Sheets

ACCESS CONTROL LIST PROCESSOR

CROSS-REFERENCE TO RELATED APPLICATIONS

This application claims priority from, and hereby incorporates by reference, U.S. Provisional Application No. 60/692,817, filed Jun. 22, 2005 and entitled "ACL'S in TCAM."

TECHNICAL FIELD

The present invention relates to processing packet traffic in a communications network.

BACKGROUND

Access control lists (ACLs) are classification filters that enable network administrators to control the processing functions applied to incoming packets in packet-switched networks. As the processing functions are typically performed within a network switch, router or other appliance, the functions are generally offered as features of the appliance and thus referred to simply as "features." ACLs were originally developed to enable administrators to specify packet forwarding rules (permitting packets meeting specified criteria to be forwarded, and denying others), but as the roles of network appliances have expanded to include various security features (e.g., encryption, TCP intercept, multicast flood suppression, VLAN-based, port-based and interface-based filters, ICMP packet suppression, etc.), quality-of-service features (e.g., rate limiting, traffic shaping, policy-based routing), billing features (e.g., accounting of traffic from a set of sources, or to a set of destinations) and so forth, so too has the demand for additional ACLs to specify whether to permit or deny application of such features to a given packet.

Figure 1:
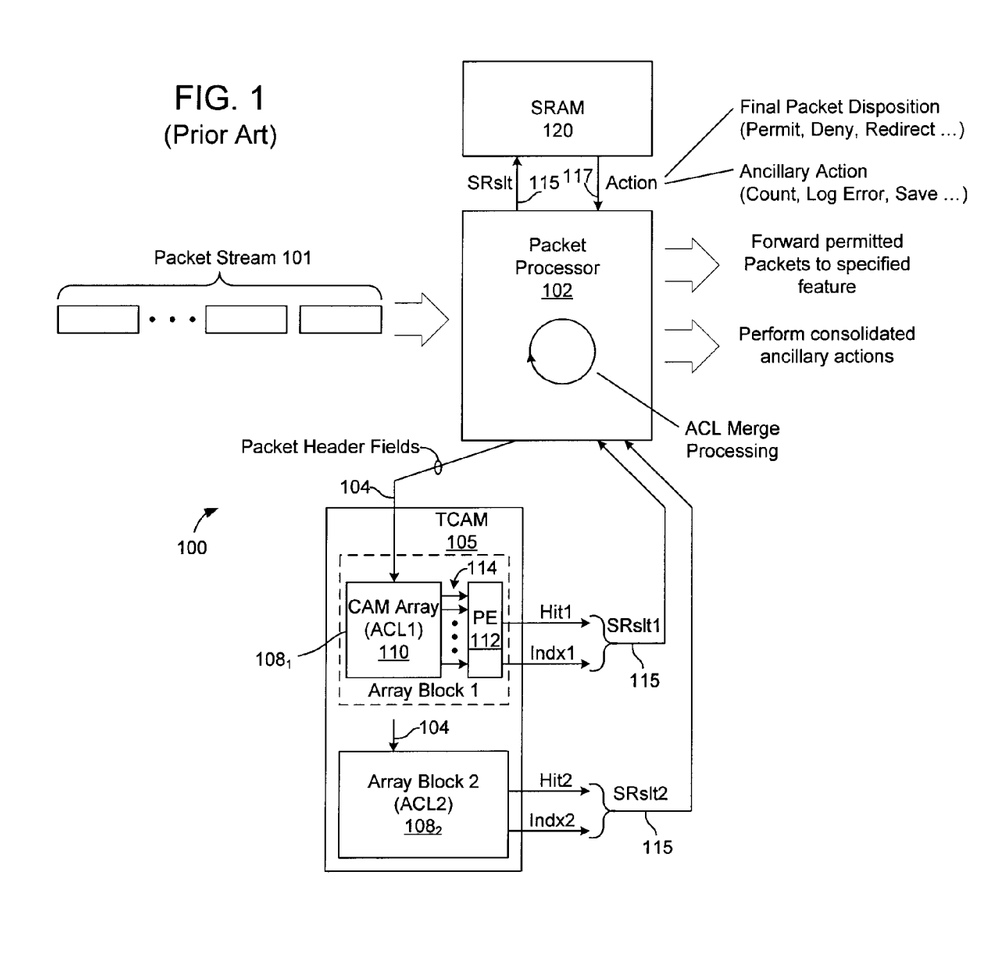
FIG. 1 illustrates a prior art packet processing system that employs access control lists (ACLs) to make packet disposition decisions.

FIG. 1 illustrates a prior art packet processing system 100 that employs ACLs to make packet disposition decisions (e.g., permit or deny application of a given feature to an incoming packet). As shown, a stream of packets 101 is supplied to a packet processor 102 such as a network processing unit (NPU) or central processing unit (CPU). The packet processor 102 constructs a search key 104 from selected fields within the packet header (e.g., source address, destination address, source port, destination port, protocol, etc.) and forwards the search key to a ternary content addressable memory 105 (TCAM). The TCAM is a specialized storage device that may be used to store binary representations of ACL rules (i.e., individual statements within an ACL that specify packet header field values, including wildcards, that a user has associated with a given packet disposition) in respective TCAM entries, and that includes circuitry to compare the supplied search key 104 to all the TCAM entries in parallel, thus effecting effect an ACL search in which the matching TCAM entries or "hits" correspond to respective ACL rules that are satisfied by the packet being processed. In a typical TCAM architecture, multiple ACLs may be stored within respective array blocks or combinations of array blocks and searched in parallel. The TCAM of FIG. 1, for example, includes two array blocks $108_1$, $108_2$ to store a pair of ACLs (ACL1, ACL2), with each array block 108 including a TCAM array 110 to store the ACL rules in respective entries (i.e., rules of ACL1 in array block $108_1$ and rules of ACL2 in array block $108_2$), and a priority encoder 112 to receive search results (i.e., via match lines 114) during each search operation and to generate a hit index (also referred to as a match address) that indicates the TCAM entry that yielded the highest priority match, and also a hit signal that indicates whether at least one match was detected. When multiple hits occur, the highest priority match is typically resolved by physical location of the matching entries, for example, with the entry in the lowest numbered row of the TCAM array being selected as the highest priority match. Thus, in a search operation within the TCAM of FIG. 1, each of the array blocks yields a hit signal ("Hit1" and "Hit2") and corresponding hit index ("Indx1" and "Indx2") for a respective one of the two ACLs (ACL1 and ACL2), each hit signal/hit index pair constituting a TCAM search result 115 (SSslt1 and SRslt2) that is returned to the packet processor 102. Typically, there are multiple array blocks (e.g., 16/32/64 are common numbers of array blocks) in a modem TCAM, and a block-level priority encoder is provided to select the highest matching location from among the match information from all the blocks. When two search results are to be output from the TCAM in parallel, search results from half of the array blocks are encoded by one block priority encoder to produce the first output search result, and search results from the other half of the array blocks are encoded by the another block priority encoder to produce the second output search result.

The packet processor 102 applies the TCAM search results 115 to address (i.e., index) an action lookup table stored within a static random access memory 120 (SRAM), and thus retrieve an action value 117 that indicates an action to be taken with respect to the packet (e.g., permit or deny application of the feature to which the ACL pertains) and a possible set of ancillary actions (e.g., count occurrence of the ACL-rule match, log an error or other value, save the packet to disk or other storage for later inspection, etc.). When all the action values 117 relating to a given packet have been retrieved, the packet processor 102 may combine the actions according to a programmed algorithm to yield a final packet action and final set of ancillary actions which are applied to permit or deny delivery of the packet to the pertinent feature and carry out the indicated ancillary actions.

Although suitable for relatively simple applications, packet processing system 100 does not scale well as the number of ACLs increases which, unfortunately, is exactly the trend as both the number of features and the number of ACLs per feature continue to escalate rapidly. In particular, TCAMs in the present state of the art are typically I/O (input/output) constrained and capable of outputting only a small number of search results in parallel. For example, more modern TCAM devices are capable of outputting two search results per search cycle, with next generation devices projected to output four search results per cycle. Accordingly, TCAMs are generally used to store and search only a small number of ACLs per packet and thus place a ceiling on the number of supported ACLs. Unfortunately, system cost and complexity increases quickly if more TCAMs are added to meet the demand for additional ACL storage, and performance penalties result if the number of ACLs required to be searched per TCAM exceed the TCAM output capability.

One approach for increasing ACL processing bandwidth is to pre-process ACLs when first defined and merge ACLs (in software, typically in the control plane) where possible prior to their storage within the TCAM. Unfortunately, pre-merging of ACLs tends to produce a resultant ACL that is equivalent to the cross-product of the merged ACLs and thus consumes exponentially more storage within the TCAM. Making matters worse, it is usually difficult to predict the efficiency of the pre-merge operation and thus whether a pre-merge of two or more ACLs will exceed the storage capacity of the TCAM. This leaves system designers in the unfortunate position of learning at time of network configuration whether the network appliance being configured is unable to support a desired combination of features.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

An access control list (ACL) processor having multiple content addressable memory (CAM) array blocks to store respective ACLs and produce corresponding ACL search results, and ACL merge circuitry to perform post-search merging of ACL search results is disclosed in various embodiments. A key benefit of such post-search merging is that it may be performed on a packet-by-packet basis (i.e., for each incoming packet) in hardware in the "datapath" of the network switch, router or other appliance. By contrast, the above-described pre-merging operations are typically performed through software execution, only at initial device configuration, and have the undesirable effect of significantly increasing storage consumption as described above.

In one embodiment, the post-search merging logic is provided instead of a conventional block-result priority encoder, and includes an action-lookup memory to lookup action specifications for each of the ACL searches, intra-feature merge logic for merging ACL action specifications that relate to the same feature, and across-feature merge logic for further merging ACL action specifications (i.e., ACL action specifications that remain after the intra-feature merge) according to a programmed across-feature merging policy. The final merge results are then packed into programmed output format for delivery to a processor (e.g., NPU or CPU) within a packet processing system via a relatively small number of I/O (input/output) circuits that generally correspond to the number of I/O circuits available for match result output within a ternary CAM (TCAM) device. These and other embodiments and aspects thereof are described in further detail below.

Figure 2:
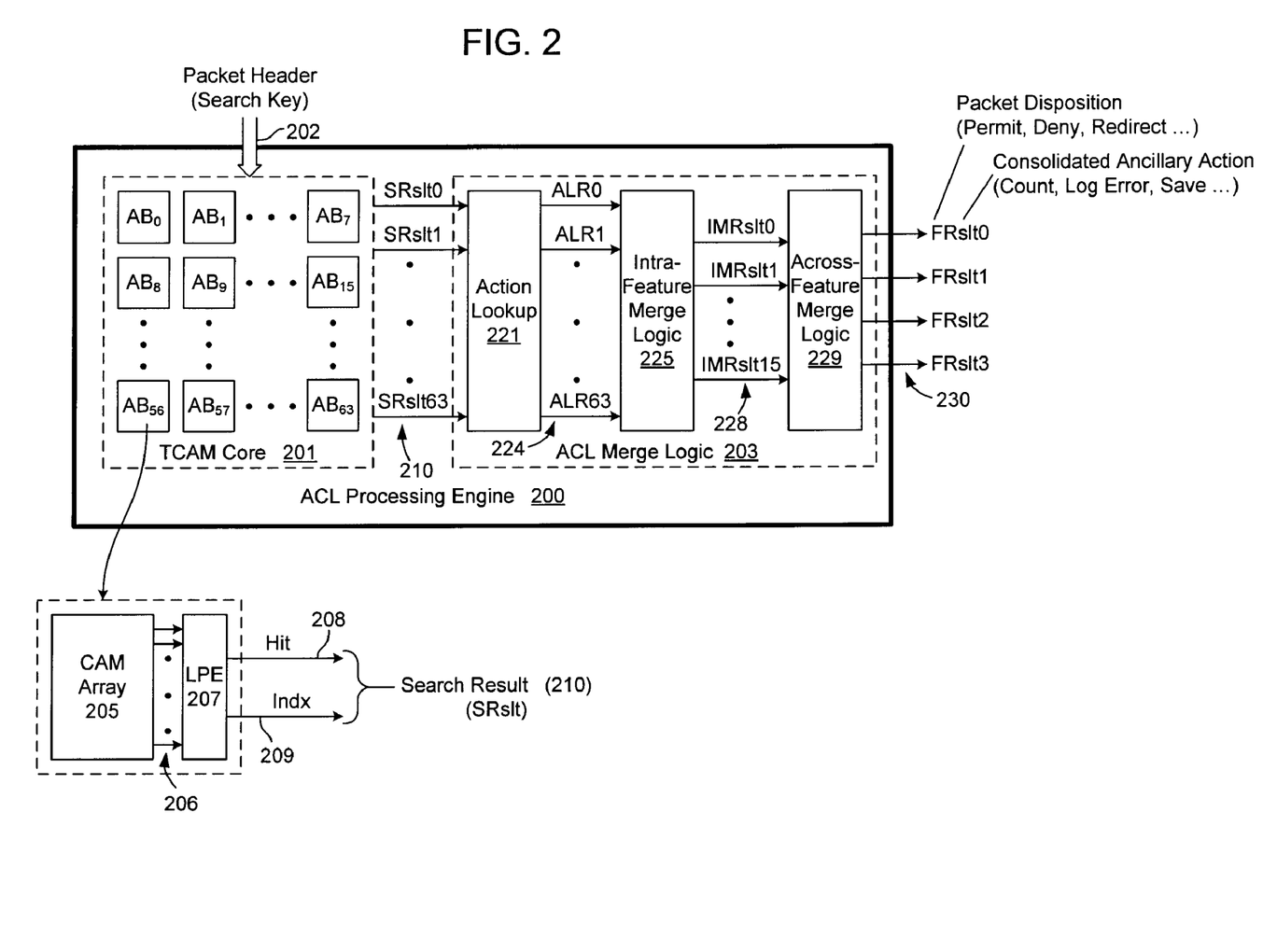
FIG. 2 illustrates an embodiment of an ACL processor having a ternary content addressable memory (TCAM) core and ACL merge logic.

FIG. 2 illustrates an embodiment of an ACL processor 200 having a TCAM core 201 and ACL merge logic 203. The TCAM core 201 includes 64 array blocks, AB0-AB63, each having a CAM array 205 that may be loaded with a respective ACL (i.e., a binary representation thereof, including wildcard or don't care fields achieved by local masking within selected TCAM storage cells) and searched to generate a set of match results that indicate whether an incoming search key 202 that has been constructed (i.e., generated, derived or otherwise obtained) from selected fields within a packet header, matches ACL rules stored within respective TCAM entries. The match results are forwarded via match lines 206 to a local priority encoder 207 (LPE) which, in response, generates a hit signal 208 ("Hit") that indicates whether any of the TCAM entries matched the search key 202, and a hit index 209 (i.e., match address, "Indx") that indicates a highest priority match from among the search-key-matching entries. The hit signal and hit index are referred to collectively herein as an array-block search result 210. The local priority encoder 207 may resolve between multiple match indications (e.g., multiple match signals asserted on match lines 206) by determining the highest priority match according to physical locations of the matching entries (e.g., TCAM entry having lowest row address or highest row address has highest priority) or other predetermined prioritizing policy, or according programmed priority information (e.g., values may be stored within the local priority encoder 207 or other array block circuitry to indicate relative priority of corresponding entries within the CAM array 205).

In contrast to a conventional TCAM device which typically includes a block-level priority encoder to receive the array-block search results 210 and perform a second stage of priority encoding to determine a highest priority match from among the array-block search results (e.g., outputting a finalized index that includes the overall highest priority match and an identifier of the array block that sourced the overall highest priority match), the array-block search results 210 generated within ACL processor 200 are forwarded to the ACL merge logic 203 where they are used to determine ACL actions for each of the ACL searches, with such actions being merged in intra-feature and across-feature merge operations. More specifically, the ACL merge logic 203 includes a set of action lookup memories 221 that are indexed (i.e., addressed) based on respective array-block search results 210 (i.e., SRslt0-SRslt63) to yield corresponding ACL action specifiers. The ACL action specifier and corresponding array-block search result collectively form an ACL lookup result 224 (ALR), with one such ACL lookup result being generated for each of the array-blocks (i.e., ALR0-ALR63) and forwarded to intra-feature merge logic 225. The intra-feature merge logic 225 performs a logical merge of ACL lookup results 224 that belong to the same feature, an operation described in greater detail below, and outputs a respective intra-feature merge result 228 for each feature. In the particular embodiment of FIG. 2 and in embodiments that follow, intra-feature merge circuitry is provided for merging ACL lookup results for up to sixteen features, and thus yields intra-feature merge results IMRslt0-IMRslt15, though support for more or fewer features may be provided in alternative embodiments.

The intra-feature merge results 228 are supplied to across-feature merge logic 229 which performs further merging according to contents of the intra-feature merge results and pre-programmed across-feature merging policies to produce final merge results. The final merge results are then packed into a programmed output format by result-packing logic within the across-feature merge logic 229 to produce final output results 230 (FRslt0-FRslt3), which specify a packet disposition action (e.g., permit, deny, redirect or other disposition of the packet with respect to a specified feature) and a consolidated ancillary action (e.g., increment an event-tracking counter, log errors of various types, save the packet to disk or other storage media for later inspection, and so forth). The final output results are output via a relatively small number of I/O circuits and thus supplied to a processor (e.g., NPU or CPU) within the host packet processing system. The processor may perform further merge operations and/or carry out the indicated disposition action and consolidated ancillary actions.

In the embodiment of FIG. 2 and embodiments described below, each of the array blocks $AB_0$-$AB_{63}$ is assumed to store a single ACL. In alternative embodiments, more than one ACL may be stored per array block and/or an ACL may span two or more array blocks. Merging may thus be performed across a set of ACLs stored in different array blocks, or even among the set of ACL rules (or ACL lines) with in the same ACL, for example, where the ACL rules are stored in different array blocks. Therefore, the merging operation may be viewed as occurring with respect to the search results of different array blocks, while the mapping of the higher level features and ACLs to the physical TCAM array blocks may vary from application to application. Also, more or fewer array blocks may be provided in alternative embodiments, with corresponding increase or decrease in ACL merge logic circuits that receive the array block outputs. Further, each or any of the entries within a given array block of TCAM Core 201 may correspond to a row of CAM cells within a CAM array or one or more segments of a row of CAM cells, or may span multiple rows of CAM cells.

Figure 3:
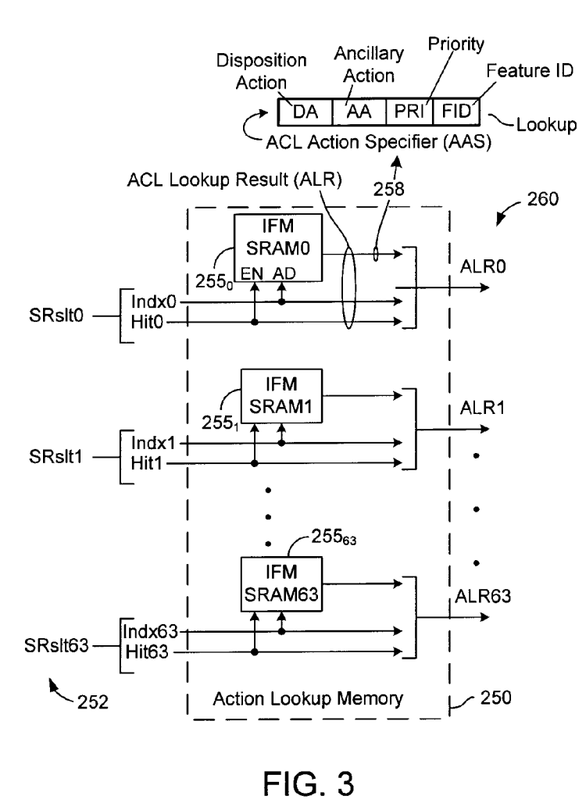
FIG. 3 illustrates an embodiment of an action lookup memory set that may be used to implement the action lookup memory set of FIG. 2.

FIG. 3 illustrates an embodiment of an action lookup memory 250 that may be used to implement the action lookup memory set 221 of FIG. 2. As shown, the action lookup memory 250 includes 64 intra-feature-merge static random-access-memories $255_0$-$255_{63}$ (IFM SRAM0-IFM SRAM31, though dynamic RAM or other types of storage may be used) that are coupled to receive array-block search results 252 from respective array-blocks within a TCAM core, and that include storage for ACL action specifiers 258 (AAS) that correspond to individual entries within the corresponding array block. Referring to IFM SRAM0 (lookup memory $255_0$), which is representative of the structure and operation of each of the IFM SRAMs, hit signal, Hit0 (i.e., from array-block 0) is supplied to an enable input (EN) of the memory, and the corresponding hit index, Indx0, is supplied to an address input (AD) of the memory. By this arrangement, when an access-enable signal (not shown) is asserted (e.g., by timing control circuitry such as a state machine, sequencing logic or other control circuitry within the ACL processor), the ACL action specifier 258 stored at memory location indicated by the hit index is read out and forwarded, along with the hit signal and the hit index, as ACL lookup result 260 (ALR0-ALR63). If the hit signal component of the array-block search result 252 (i.e., Hit0-Hit63) is deasserted (e.g., indicating that no hit occurred within the corresponding array block), the corresponding IFM SRAM 255 will not be accessed, so that resultant ACL action specifier within the ACL lookup result 260 will be invalid (the invalidity being indicated to downstream logic by the deasserted hit signal).

Still referring to FIG. 3, in one embodiment each ACL action specifier 258 includes a feature identifier (ID) field (FID) that indicates the feature to which the ACL (i.e., the binary representation of the ACL within the corresponding array block) belongs, a priority field (PRI) which is used by downstream intra-feature merge logic to merge ACL action specifiers 258 that share the same feature ID, an ancillary action field (AA) that indicates ancillary actions potentially to be carried out for the packet being processed, and a disposition action that indicates a potential disposition of the packet. The disposition action and ancillary action are referred to as potential actions at this stage, because they may be superseded, qualified or modified by other disposition actions or ancillary actions that relate to the same feature (intra-feature merge) or that relate to different features (across-feature merge).

Figure 4:
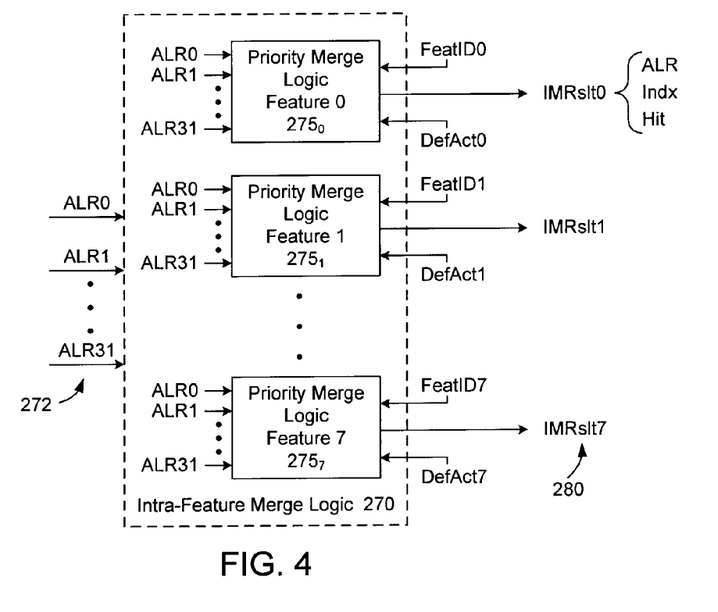
FIG. 4 illustrates an embodiment of an intra-feature merge logic circuit that may be used to implement a portion of the intra-feature merge logic circuit of FIG. 2.

FIG. 4 illustrates an embodiment of an intra-feature merge logic circuit 270 that may be used to implement a portion of the intra-feature merge logic circuit 225 of FIG. 2. More specifically, in an ACL processor that generates 64 ACL lookup results (ALR0-ALR63), the intra-feature merge logic 270 may be used to perform intra-feature merge operations with respect to half the ACL lookup results (ALR0-ALR31), and an identical logic circuit, though with potentially different configuration settings, may be used to perform intra-feature merge operations with respect to the other half of the ACL lookup results. This bifurcation, which is carried forward in embodiments of component circuits of the intra-feature merge logic 270 and in embodiments of across-feature merge logic discussed below, reduces signal routing congestion within the intra-feature merge logic 270 and downstream circuitry. In alternative embodiments, intra-feature merge logic 270 may include inputs to receive all the ACL lookup results generated by the TCAM core within an ACL processor in a given search cycle, and the downstream logic circuitry configured accordingly to receive a larger number of outputs from the intra-feature merge logic 270.

In the embodiment shown, intra-feature merge logic 270 includes eight priority merge logic circuits $275_0$-$275_7$ that correspond to eight different features for which intra-feature merge operations are to be performed. The counterpart intra-feature merge logic (i.e., the logic circuit that receives input signals ALR32-ALR63, not shown) includes an additional eight priority merge logic circuits 275, thus providing intra-feature merge support for up to sixteen features total. More or fewer priority merge logic circuits 275 may be provided in alternative embodiments to support more or fewer intra-feature merge operations.

Each of the priority merge logic circuits 275 is coupled to receive the full complement of ACL lookup results 272 provided to the intra-feature merge logic circuit 270 (thus receiving ACL lookup results, ALR0-ALR31), and is additionally coupled to receive a respective one of programmed (or pre-programmed) feature IDs, FeatID0-FeatID7, and a respective one of programmed default ACL action specifiers, DefAct0-DefAct7. The programmed feature IDs enable a network administrator or other system user to specify the particular features for which intra-feature merge operations are to be performed, for example, through a sequence of prompts (e.g., in a user interface that is part of or supported by a host system that includes the ACL processor) that relate features of interest to feature IDs and that enable the administrator to pre-program the features within programmable storage within the host system. The default ACL action specifiers are used to specify default actions to be applied if none of the ACL lookup results indicate a TCAM hit with respect to the programmed feature ID.

In one embodiment, each of the priority merge logic circuits 275 includes circuitry to identify a set of ACL lookup results 272 that relate to the programmed feature ID (i.e., feature ID field (FID) of component ACL action specifier matches programmed feature ID) and to compare composite priority values within the identified ACL lookup results 272 with one another to determine a highest-priority ACL lookup result. The highest priority ACL lookup result that relates to the programmed feature ID is then output as an intra-feature merge result 280 (IMRslt0-IMRslt7), thus effecting an intra-feature merge. In one embodiment, the composite priority value for each ACL lookup result 272 is formed in part by the hit signal component of the ACL lookup result and in part by the priority field (PRI) within the ACL action specifier component of the ACL lookup result. Also, the default action (DefAct1-DefAct7) supplied to each priority-merge logic circuit $275_0$-$275_1$ may be assigned a priority value that corresponds to a combination of an asserted hit signal and the lowest possible PRI field value. Consequently, by designating the hit signal component of each ACL lookup result 272 as the most significant bit of the composite priority value, the default action will be deemed to have a higher priority than any of the ACL lookup results for which the component hit signal is deasserted, and thus will be output as the intra-feature merge result 280 if none of the ACL lookup results 272 that relate to the programmed feature ID indicate TCAM hits.

Figure 5:
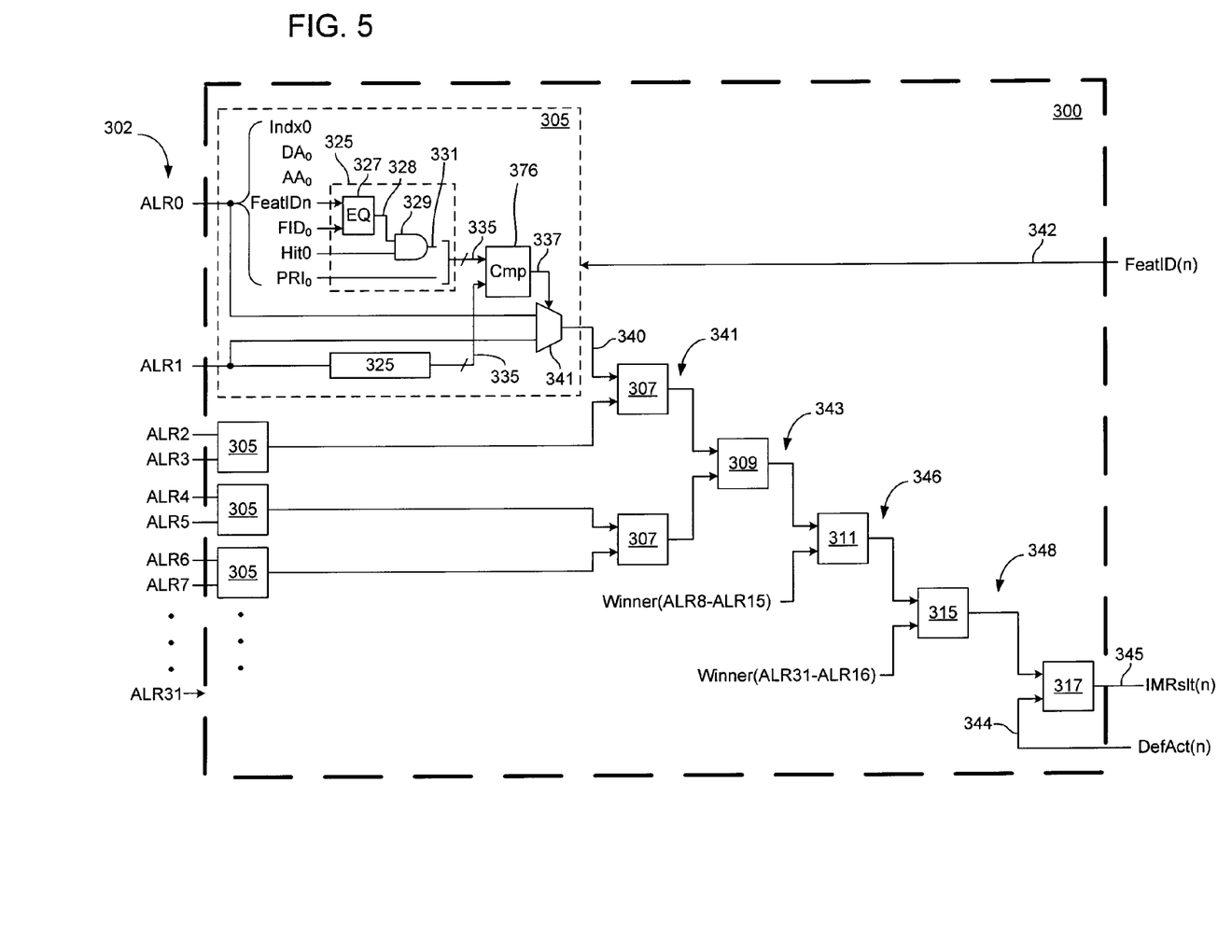
FIG. 5 illustrates an embodiment of a multi-stage priority-comparison circuit that may be used to implement an individual one of priority merge logic circuits of FIG. 4.

FIG. 5 illustrates an embodiment of a multi-stage priority-comparison circuit 300 that may be used to implement an individual one of priority merge logic circuits $275_0$-$275_7$ of FIG. 4. As shown, ACL lookup results 302 are supplied in pairs to a set of first-stage priority comparators 305. Referring to the detail view of priority comparator 305 that receives ACL lookup results ALR0 and ALR1 (and which is representative of the other first-stage priority comparators 305), a relevance detector 325 is provided to generate the most significant bit (MSB) 331 of a composite priority value 335, and includes an equality comparator 327 to compare a programmed feature ID 342 (FeatID(n), where n is an index that ranges from 0-7 when applied within the intra-feature merge logic of FIG. 4) with the feature ID field of a first ACL lookup result (ALR0 in this example, and thus $FID_0$) to yield a feature match signal 328 that indicates whether the ACL lookup result relates to the programmed feature ID. That is, the feature match signal 328 is asserted if the programmed feature ID 342 and ALR feature ID field match, and deasserted if the programmed feature ID 342 and ALR feature ID field do not match. Note that wild cards (e.g., bit masking or don't care specifications in selected bit-compare positions) may be used to establish a range of feature IDs that will result in feature match signal assertion.

Still referring to the relevance detector 325, the feature match signal 328 is logically ANDed in AND gate 329 with the ACL hit signal (Hit0 in this example) to generate the MSB 331 of the composite priority value 335, with the less significant bits of the composite priority value 335 being drawn from the priority field of the ALR (i.e., from the PRI field of the ACL action specifier component of ALR0, $PRI_0$). Thus, the MSB 331 of the composite priority value 335 will be deasserted for any ACL lookup result that does not relate to the programmed feature ID or for which no TCAM hit was detected.

Referring still to circuitry within first-stage priority comparators 305, the composite priority values generated for ACL lookup results ALR0 and ALR1 are compared in a comparator 336 which outputs a logic high or low compare-result signal 337 according to whether the composite priority value generated for ALR1 exceeds the composite priority value 335 generated for ALR0 (in one embodiment, the lower numbered ACL lookup result, ALR0, is deemed the comparison winner if the two composite priority values 335 are equal, though different and/or programmable tie-breaking policies may be applied). The compare-result signal 337 is supplied to a multiplexer or other selector circuit 341 which responds by passing the ACL lookup result that sourced the highest composite priority value as a winning ACL lookup result 340.

Each of the other first-stage priority comparators 305 (not all of which are shown) similarly output winning ACL lookup results, with the winning ACL lookup results from all the first-stage priority comparators 305 being supplied in pairs to second-stage priority comparators 307 (not all of which are shown). The second-stage priority encoders operate similarly to the first-stage priority encoders to produce a second-stage of winning ACL lookup results 341 that are similarly supplied in pairs to third-stage priority comparators 309 (not all of which are shown). Winning ACL lookup results 343 are similarly generated by the third-stage priority comparators 309 and supplied in pairs to fourth-stage priority comparators 311, and the two final winning ACL lookup results 346 (winner of ACL0-15 output from fourth-stage priority comparator 311 and winner of ACL16-31 comparison output from a fourth-stage priority comparator not shown) are supplied to fifth-stage priority encoder 315 to determine a final winning ACL lookup result 348. In the embodiment of FIG. 5, the final winning ACL lookup result 348 is supplied to a final-stage priority encoder 317 for comparison with the programmed default action value 344. As discussed, in one embodiment, the default action value is assigned a composite priority value having an asserted MSB (e.g., MSB='1') and lowest possible value for the remaining bits (e.g., PRI field='00 . . . 0') so that the default action value 344 will be output as the intra-feature merge result 345 (IMRslt(n)) if no TCAM hit occurred in an ACL relating to the programmed feature ID. Otherwise, the final winning ACL lookup result 348 will be output as the intra-feature merge result 345.

It should be noted that various alternative circuits may be used to implement the priority merge logic circuits $275_0$-$275_7$ of FIG. 4. For example, instead of a multi-stage priority comparator as shown in FIG. 5, a single stage of combinatorial logic (e.g., synthesized in response to an expression of the desired comparison result) may be used to produce the intra-feature merge result 345. Also, within the multi-stage priority comparator 300 of FIG. 5, the composite priority value 335 for the first-stage winner 340 may be carried forward to subsequent priority comparator stages 307, 309, 311, 315, 317 so that those priority comparator stages need not include relevance detector circuits 325 to regenerate composite priority values 335 for the input ACL lookup results 302.

Figure 6:
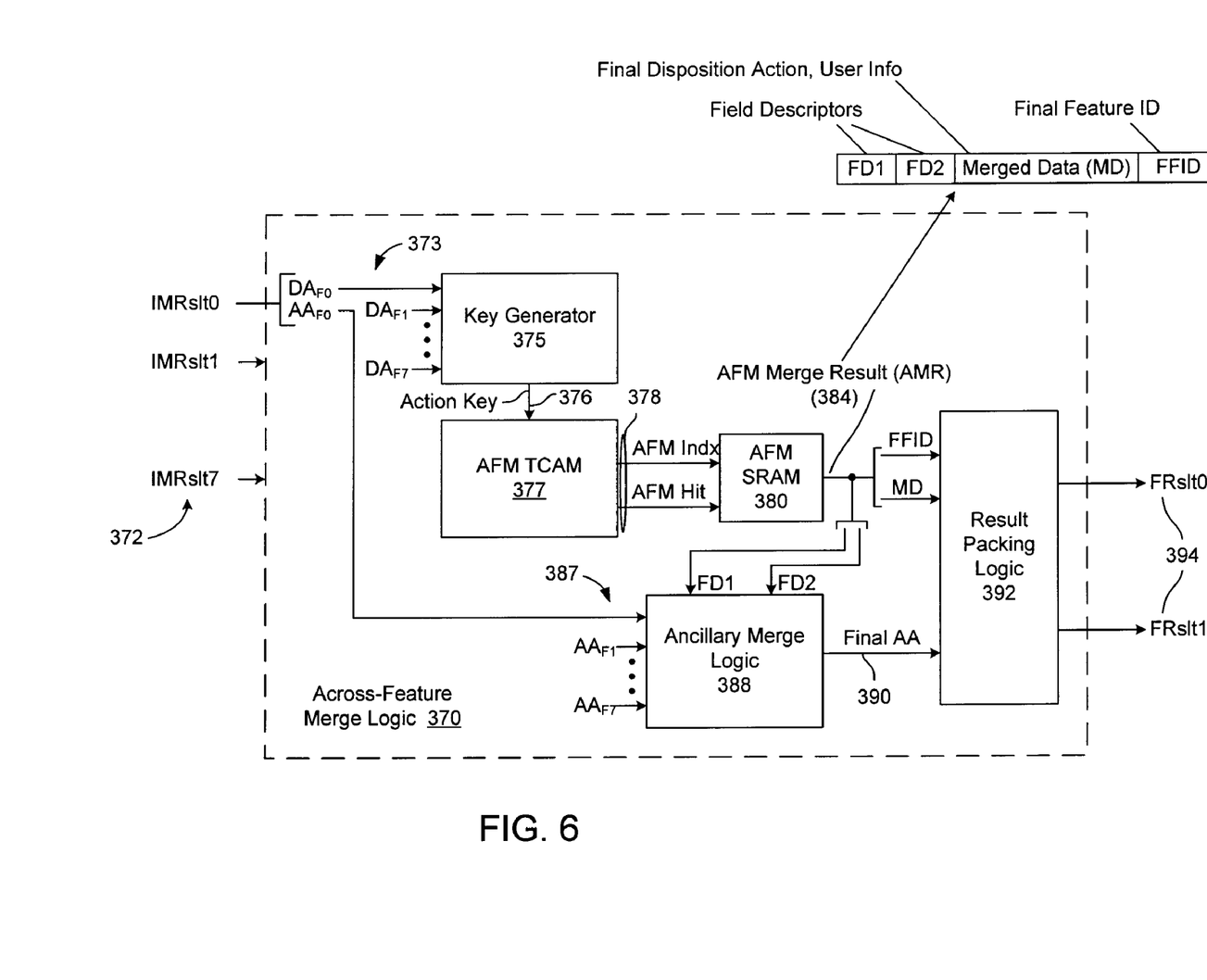
FIG. 6 illustrates an embodiment of across-feature merge logic that may be used to implement a portion of the across-feature merge logic of FIG. 2.

FIG. 6 illustrates an embodiment of across-feature merge logic 370 that may be used to implement a portion of the across-feature merge logic 229 of FIG. 2. More specifically, in the embodiment shown, the across-feature merge logic 370 receives intra-feature merge results 372 from an intra-feature merge logic circuit such as logic circuit 270 of FIG. 5, and thus receives half the total number of intra-feature merge results 372 generated within the ACL processor.

Accordingly, counterpart across-feature merge logic (e.g., another circuit identical to logic circuit 370) may be provided to perform across-feature merge operations with respect to intra-feature merge results for the remaining eight features. Also inputs and circuitry may be provided to support more or fewer intra-feature merge results 372 in alternative embodiments.

In the particular embodiment of FIG. 6, the intra-feature merge logic 370 includes a key generator circuit 375 that receives the disposition action field within each of the intra-feature merge results 272 (i.e., $DA_{F0}$-$DA_{F7}$, where the disposition action field is carried forward in the ACL action specifier component of the winning ACL lookup result, and the subscript indicates the feature that sourced the intra-feature merge result) and applies the set of disposition action fields 373 to generate a search key 376 referred to herein as an action key. In one embodiment, the key generator may be implemented by pass-through circuitry (or a register) that concatenates the input disposition action fields 373 to form the action key 376. Alternatively, the key generator 375 may include fixed or programmable bit steering and/or compacting circuitry to reorder selected bits within the disposition action fields 373, to reorder the disposition action fields 373 relative to each other, to remove selected bits from the disposition action fields 373 or entire disposition action fields 373 from the resultant action key 376, and/or to mask selected bit positions within the action key 376.

The action key 376 constructed (or passed) by the key generator 375 is supplied to a relatively small TCAM 377 referred to herein as an across-feature-merge TCAM (AFM TCAM). The AFM TCAM 377 may be constructed in generally the same manner as one of the array blocks within the TCAM core 201 of FIG. 2 (or could, in fact, physically be one or more of the array blocks within the core TCAM of the ACL processor (e.g., element 201 of FIG. 2)), and thus carries out a search operation to determine whether any of the AFM TCAM entries contain a value, referred to herein as an across-feature merge rule (AFM rule), that matches the combination of feature-specific disposition actions (or portions thereof) represented by the action key 376. If the action key 376 matches one or more AFM rules, the AFM TCAM 377 asserts an AFM hit signal ("AFM Hit") and outputs an AFM index ("AFM Indx") that indicates the highest-priority search-key-matching entry in the AFM TCAM 377. Note that other types of lookup engines may be used instead a TCAM to look up AFM rules including, without limitation, a tree data structure stored in one or more random access memories (e.g., SRAMs or DRAMs) and having AFM rules stored therein to enable searching by a state machine, on-die processor or external processor or controller. The AFM index and AFM hit signal collectively form an AFM search result 378 and are used to index a memory 380 referred to herein as an AFM action memory (an SRAM memory in the example of FIG. 6, though other types of storage may be used) in generally the same way that individual array-block search results are applied to index the action lookup memories 255 of FIG. 3 and thus, in the case of an AFM Hit (i.e., AFM Hit signal asserted), read out an AFM action memory entry referred to herein as an AFM merge result 384 (AMR). In one embodiment, the AFM merge result 384 includes a final feature ID field (FFID) which may be used by external devices to determine where to find additional data and/or action definitions associated with the overall ACL search; a merged data field (MD) that specifies a final disposition action (e.g., permit, deny, redirect, etc.) to be performed with respect to the final feature indicated by the final feature ID, and one or more field descriptors that may indicate operations or a source of operations to be carried out to consolidate ancillary actions indicated by the ancillary action fields of the input intra-feature merge results 372. In the particular embodiment shown, the AFM merge result 384 includes two field descriptors, FD1 and FD2, that are supplied to ancillary merge logic 388 along with the ancillary action fields 387 ($AA_{F0}$-$AA_{F7}$), though more or fewer field descriptors or a programmed number of field descriptors may be supplied to the ancillary merge logic 388 in alternative embodiments. In any case, the ancillary merge logic 388 consolidates or attempts to consolidate the ancillary action fields 387 in a manner indicated by the field descriptors, FD1 and FD2, to generate a final ancillary action value 390 ("Final AA").

The final ancillary action value 390 is supplied, along with the final feature ID (FFID) and merged data (MD) components of the AFM merge result 384, to result packing logic 392. In one embodiment, the result packing logic 392 combines programmatically selected bits of the final feature ID, merged data and final ancillary action values to produce a final result value that is output in respective halves via final result interfaces 394, FRslt0 and FRslt1. For example, in one embodiment, the final feature ID, merged data and final ancillary action values are reduced to a 48-bit final result value which is output via a 48-bit final-result interface logically partitioned between a first 24-bit output interface, FRslt0, and a second 24-bit output interface, FRslt1.

Reflecting on the functions of the AFM TCAM 377 and AFM action memory 380, it can be seen that a network administrator or other operator may determine that a particular combination of disposition actions for different, but related (or even disparate) features are to be merged in a particular manner and then specify such across-feature merge operation by storing one or more AFM rules that represent the desired combination of disposition actions within the AFM TCAM 3777 and storing the corresponding AFM merge result within the AFM action memory 380 (i.e., more precisely, the network administrator or other user may provide input that causes the desired AFM rules and AFM merge results to be stored). Thus, the across-feature merge logic 370 allows a user to flexibly specify rules for merging disposition actions and ancillary actions that result from an intra-feature merge operation to yield a final set of actions to be performed by a host processor or other external control circuit.

It should be noted that, while the initial TCAM search results (i.e., hit signal and hit index for each of the array blocks) are not specifically shown to be carried forward beyond the intra-feature merge logic 225 of FIG. 2, such signals may be carried forward to the across-feature merge logic (e.g., to enable selective packing within the result packing logic and thus output to the host processor) or even output from the ACL processor in selected embodiments. For example, instead of providing the final feature ID field (FFID) to the result packing logic 392, the hit index for the winning feature output from the intra-feature merge logic (e.g., element 225 of FIG. 2) may be supplied to the result packing logic 392 to provide an indication of the feature ID. Also, the FFID field and hit index of the winning feature may be provided to the result packing logic 392.

Figure 7:
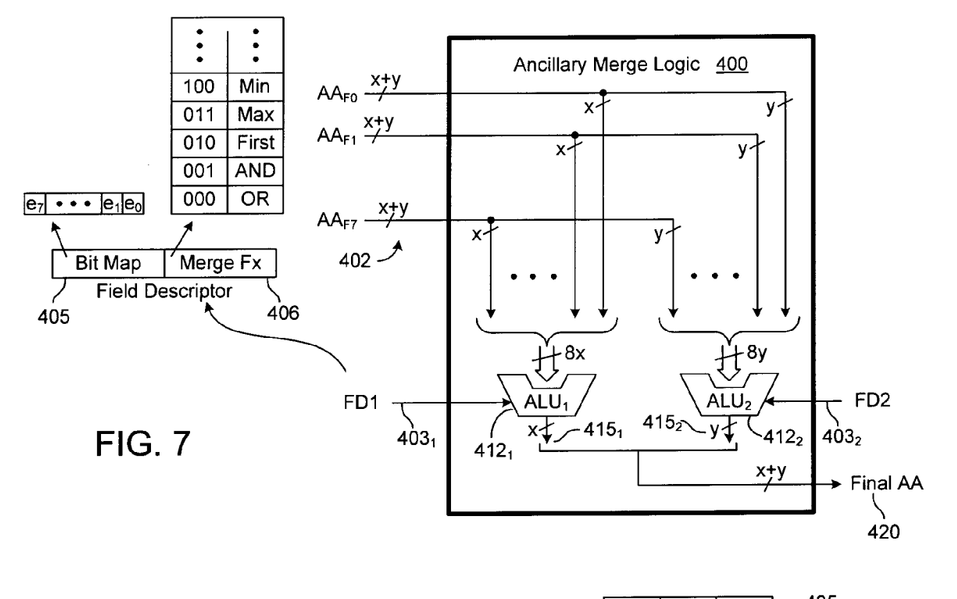
FIG. 7 illustrates an embodiment of ancillary merge logic that may be used to implement the ancillary merge logic of FIG. 6.

FIG. 7 illustrates an embodiment of ancillary merge logic 400 that may be used to implement the ancillary merge logic 388 of FIG. 6. In the particular embodiment shown, the ancillary merge logic 400 includes two arithmetic-logic units $412_1$, $412_2$ ($ALU_1$ and $ALU_2$) each coupled to receive a respective one of two field descriptors $403_1$, $403_2$ obtained from an entry within an AFM action memory (e.g., element 380 of FIG. 6). In alternative embodiments, the ancillary merge logic 400 may include more or fewer ALUs 412 in accordance with the number of field descriptors 403 (which number may be programmatically determined) included within each AFM action memory entry.

In one implementation, each of the field descriptor values 403 includes a bit map field 405 ("Bit Map") and a merge function field 406 ("Merge Fx"). The bit map field 405 indicates which of the incoming feature-specific ancillary action values 402 (, $AA_{F0}$-$AA_{F7}$), are to be applied within the corresponding ALU 412 in an arithmetic or logic operation. For example, each bit of the bit map field 405 may correspond to a respective one of the ancillary action values 402 and may be high or low to indicate that the corresponding ancillary action value is to be applied or not applied. The merge function field 406 specifies the logical (e.g., Boolean), arithmetic and/or selection function to be applied to merge or otherwise consolidate individual bits within the ancillary action values 402 indicated by the bit map field 405. In the particular embodiment of FIG. 7, for example, the merge function field 406 is an encoded three-bit field that indicates one of eight logical, arithmetic or selection operations. More or fewer operations may be supported in alternative embodiments (i.e., with commensurate change in the merge function field size), and various merge functions other than the exemplary functions (i.e., without limitation, bit-wise-logic OR, bit-wise logic AND, first-occurrence, bit-wise or value-wise maximum or minimum, etc.) may be specified. In any case, each of the ALUs $412_1$, $412_2$ operates on a slice of bits within the incoming ancillary action values 402, carrying out the merge-function-specified operation with respect to the bit-map-specified ancillary action values 402 to generate respective one of partial final ancillary action results $415_1$ and $415_2$. In the embodiment of FIG. 7, for example, the first 'x' bits of each of the ancillary action values 402 is supplied to ALU $412_1$, and the remaining 'y' bits of each of the ancillary action values 402 is supplied to ALU $412_2$. Though not specifically shown in FIG. 7, a partitioning circuit may be provided to determine the number of bits 'x' and number of bits 'y' supplied to ALUs $412_1$ and $412_2$, respectively, in accordance with a programmed partitioning value. In any case, the partial final ancillary action results $415_1$, $415_2$ generated by the ALUs 412 may be concatenated and output as a final ancillary action result 420.

Figure 8:
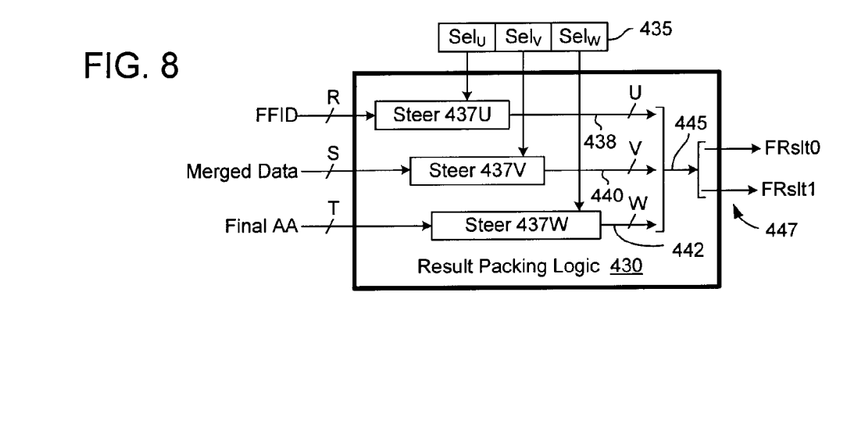
FIG. 8 illustrates an embodiment of result packing logic that may be used to implement the result packing logic of FIG. 6.

FIG. 8 illustrates an embodiment of result packing logic 430 that may be used to implement the result packing logic 392 of FIG. 6. As shown, the result packing logic 430 includes bit-steering circuits 437U, 437V, 437W coupled to receive the final feature ID (FFID), merged data and final ancillary action (Final AA) values, respectively. Each of the steering circuits 437, 439, 44responds to a respective bit selection value, $Sel_U$, $Sel_V$, $Sel_W$ (e.g., bit maps, which may alternatively be consolidated into a single selection value) within configuration circuit 435 by passing a selected subset of bits within each of the received values to be included within a final result value 445. Thus, steering circuit 437U steers up to U bits of an incoming R-bit final feature ID value to output node 438, steering circuit 437V steers up to V bits of an incoming S-bit merged data value to output node 440, and steering circuit 437W steers up to W bits of a T-bit final ancillary action value to output node 442. In general, the values of U, V and W may be adjusted according to corresponding selection values ($Sel_U$, $Sel_V$, $Sel_W$) within configuration circuit 435 and may range from zero to the number of bits within the corresponding input value (R, S, and T) with the constraint that the sum of U, V and W does not exceed the I/O path width available to output the final result value 445, which is formed by aggregation of the bits output from the steering circuits 437. As shown, the final result value 445 is output via respective final result interfaces 447 (FRslt0 and FRslt1), each of which may be used to convey half the total number of bits in the final result value 445. In an alternative embodiment, the sum of U, V and W may be allowed to exceed the width of the final result interfaces 447, and the final result value 445 transmitted via the interfaces 447 in multiple successive transmission cycles.

Figure 9:
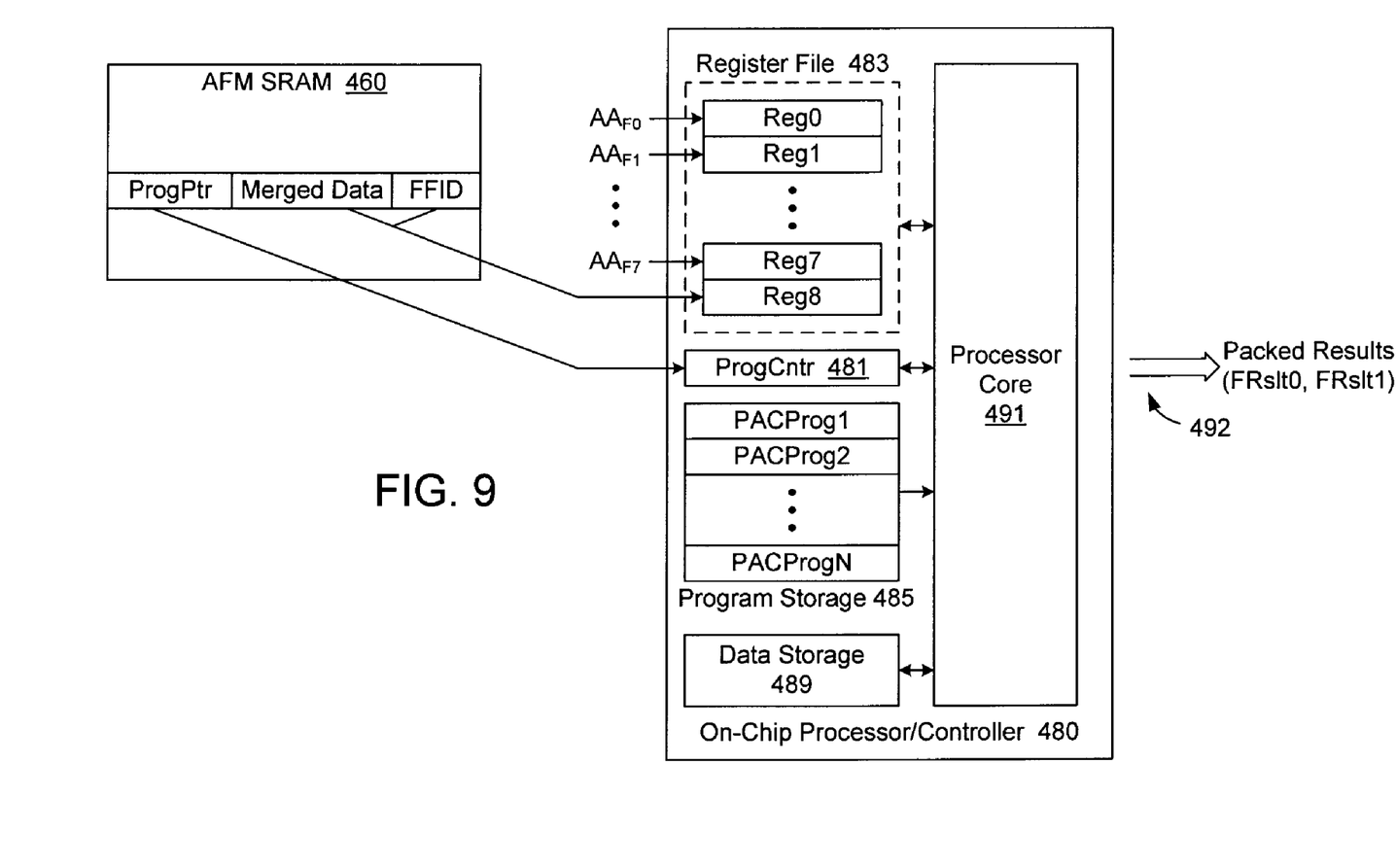
FIG. 9 illustrates an embodiment of an on-chip processor or controller that may be used instead of the dedicated logic circuits of FIGS. 7 and 8 to perform ancillary action merge operations and to pack final results into a format for output from the ACL processor.

FIG. 9 illustrates an embodiment of an on-chip processor or controller 480 that may be used instead of the dedicated logic circuits of FIGS. 7 and 8 to perform ancillary action merge operations and to pack final results into a format for output from the ACL processor. As shown, instead of field descriptors, each of the entries within an AFM action memory 460 (i.e., a memory that is a potentially width-modified version of memory 380 of FIG. 6) includes a program pointer value, "ProgPtr," which may be loaded into a program counter 481 within the on-chip processor 480 to select one of a plurality of programmed code sequences within program storage 485 (e.g., PACProg1-PACProgN, each of which may include macro-code and/or micro-code instruction sequences) that specify respective sets of packing and ancillary consolidation operations to be performed with respect to the merged data and final feature ID fields within the indexed AFM action memory entry 460 (i.e., indexed by the AFM index as described in reference to FIG. 6) and the ancillary action values, $AA_{F0}$-$AA_{F7}$ received from the intra-feature merge logic. More specifically, in one embodiment, the on-chip processor 480 includes a register file 483 having registers, Reg0-Reg7, that may be loaded in parallel or sequentially with ancillary action values $AA_{F0}$-$AA_{F7}$ (e.g., acquiring the ancillary actions individually or in groups via a bus coupled to the intra-feature merge logic), and a register, Reg8, which may be loaded with the merged data and final feature ID fields indexed within the AFM action memory 460. Additional registers may be provided as necessary for processor operation or to enable wider field storage.

A processor core 491 within the on-chip processor 480 executes the program instructions stored within the program storage memory 485 at the location indicated by the program counter (i.e., using the program pointer value loaded from the AFM action memory 460), and thus may perform virtually any consolidation or merging operations with respect to the ancillary action values stored within the register file 483 to produce a final ancillary action value. The final ancillary action value and any temporary values generated by the processor core 491 may be stored within additional operational registers (not shown) and/or data storage 489. The processor core 491 may similarly execute program instructions to perform virtually any selection of bits within the merged data, final feature ID and final ancillary action value to produce packed output results that may be output from the ACL processor as the final output result 492 (FRslt0 and FRslt1). Though not shown, the on-chip processor 480 may additionally process the counterpart merged data, final feature ID and final ancillary action that result from ACL searches within array blocks 32-63 of FIG. 2 to produce final output results, FRslt2 and FRslt3.

It should be noted that in an embodiment that includes the on-chip processor of FIG. 9, the on-chip processor may be applied, where practicable in view of time constraints, to carry out various other functions described as being performed by dedicated circuits in alternative embodiments including, for example and without limitation, the functions within the key generator 375 of FIG. 6 and functions within the priority merge logic circuits 275 of FIG. 4. Also, various types of programmable logic (e.g., programmable logic devices (PLDs), field-programmable gate arrays (FPGAs), etc.) may be used to implement some or all of the circuitry within the intra-feature merge logic and across-feature merge logic described in reference to embodiments above.

While the ACL processor of FIG. 2 (including various component embodiments shown in FIGS. 3-9) may be implemented in a single semiconductor die, the functional blocks therein may be split between multiple integrated circuit dice that are disposed within a common integrated circuit package and coupled to one another.

It should be noted that the various integrated circuits, dice and packages disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An integrated circuit device comprising:
   a first content addressable memory (CAM) including a plurality of CAM blocks to generate respective match indices, each match index indicating a storage location within the corresponding CAM block of an entry that matches a search key; and
   a plurality of memory arrays to receive the match indices from the plurality of CAM blocks and to output respective lookup values from storage locations indicated by the match indices, each lookup value including information that indicates an action to be taken with respect to a packet used to obtain the search key and information that indicates a merging operation for merging the action with one or more actions indicated by information in others of the lookup values.

2. The integrated circuit device of claim 1 further comprising a first logic circuit to merge the information included within at least a portion of the lookup values.

3. The integrated circuit device of claim 2 wherein each lookup value includes information that indicates a priority of the action to be taken with respect to the packet relative to actions indicated by information in others of the lookup values.

4. The integrated circuit device of claim 3 wherein the first logic circuit includes circuitry to compare the information that indicates the priority of an action indicated by a first one of the lookup values with information that indicates the priority of an action indicated by a second one of the lookup values and to output either the first one of the lookup values or the second one of the lookup values as a selected lookup value based on whether the priority of the action indicated by the first one of the lookup values exceeds the priority of the second one of the lookup values.

5. The integrated circuit device of claim 2 wherein each of the lookup values additionally includes an identifier value that corresponds to an operation to be conditionally performed with respect to the packet, and wherein the first logic circuit comprises comparison circuitry to compare the identifier value within each of the lookup values with an identifier-selection value to determine the portion of the lookup values.

6. The integrated circuit device of claim 1 further comprising a plurality of logic circuits each to merge the information included within a respective subset of the lookup values.

7. The integrated circuit device of claim 6 wherein the plurality of logic circuits output a plurality of merged values that are fewer in number than the plurality of lookup values.

8. The integrated circuit device of claim 6 wherein the plurality of logic circuits output a plurality of merged values and wherein the integrated circuit device further comprises a second CAM to receive a second search key formed, at least in part, from contents within the plurality of merged values, and to output a index value that indicates a manner of merging at least two of the merged values.

9. The integrated circuit device of claim 1 further comprising a lookup circuit to look up a rule for merging the action with the one or more actions indicated by information in others of the lookup values.

10. The integrated circuit device of claim 9 wherein the lookup circuit comprises circuitry to receive a lookup index that includes at least a portion of the action and at lest a portion of the one or more actions indicated by information in others of the lookup values.

11. The integrated circuit device of claim 9 wherein the lookup circuit comprises a second CAM.

12. The integrated circuit device of claim 11 wherein the lookup circuit further comprises a lookup memory that is indexed based on a match address generated by the second CAM, the lookup memory to store information that indicates a merged action value to be output from the integrated circuit device.

13. An integrated circuit device comprising:
a plurality of content addressable memory (CAM) blocks;
a plurality of lookup memories;
means for comparing a search key with contents of the plurality of CAM blocks in concurrent search operations to generate a plurality of match indices; and
means for concurrently addressing a plurality of lookup memories using the plurality of match indices to retrieve respective lookup values, each lookup value indicating an action be taken with respect to a packet used to obtain the search key and a merging operation for merging the action with one or more actions indicated by others of the lookup values.

14. A method of operation within an integrated circuit device, the method comprising:
comparing a search key with contents of a plurality of content addressable memory (CAM) blocks in concurrent search operations to generate a plurality of match indices; and
concurrently addressing a plurality of lookup memories using the plurality of match indices to retrieve respective lookup values, each lookup value indicating an action be taken with respect to a packet used to obtain the search key and a merging operation for merging the action with one or more actions indicated by others of the lookup values.

15. The method of claim 14 wherein comparing a search key with contents of a plurality of CAM blocks in concurrent search operations comprises comparing a search key constructed based, at least in part, on one or more header fields within the packet with respective access control lists stored within the plurality of CAM blocks.

16. The method of claim 14 wherein each lookup value further indicates a packet processing feature associated with the action indicated by the lookup value, and wherein the method further comprises merging at least two of the actions associated with matching packet processing features.

17. The method of claim 16 wherein merging at least two of the actions associated with matching packet processing features comprises consolidating the at least two of the actions into a single action based, at least in part, on prioritizing information associated with each of the two actions.

18. The method of claim 14 further comprising:
generating a search key based on selected fields within the lookup values; and
comparing the search key with a plurality of rules for merging the actions indicated by the lookup values.

19. The method of claim 18 further comprising:
identifying a first rule that matches the search key within the plurality of rules for merging the actions;
generating an index that corresponds to the first rule; and
retrieving a merged action value from a location with another lookup memory based on the index that corresponds to the first rule.

20. The method of claim 19 further comprising outputting at least a portion of the merged action value from the integrated circuit device.

21. Computer-readable storage media having information embodied therein that includes a description of an integrated circuit device, the information including descriptions of:
a first content addressable memory (CAM) including a plurality of CAM blocks to generate respective match indices, each match index indicating a storage location within the corresponding CAM block of an entry that matches a search key; and
a plurality of memory arrays to receive the match indices from the plurality of CAM blocks and to output respective lookup values from storage locations indicated by the match indices, each lookup value including information that indicates an action to be taken with respect to a packet used to obtain the search key and information that indicates a merging operation for merging the action with one or more actions indicated by information in others of the lookup values.

* * * * *

UNITED STATES PATENT AND TRADEMARK OFFICE
CERTIFICATE OF CORRECTION

| | |
|---|---|
| PATENT NO. | : 7,389,377 B2 |
| APPLICATION NO. | : 11/426011 |
| DATED | : June 17, 2008 |
| INVENTOR(S) | : Pankaj Gupta |

It is certified that error appears in the above-identified patent and that said Letters Patent is hereby corrected as shown below:

Claim 10, column 15, line 40, change "at lest a" to --at least a--.

Claim 14, column 16, line 9, change "an action be" to --an action to be--.

Signed and Sealed this

Sixteenth Day of December, 2008

JON W. DUDAS
*Director of the United States Patent and Trademark Office*